United States Patent [19]

Bosnyak et al.

[11] Patent Number: 4,868,424
[45] Date of Patent: Sep. 19, 1989

[54] TTL CIRCUIT WITH INCREASED TRANSIENT DRIVE

[75] Inventors: Robert J. Bosnyak, Portland, Oreg.; Jeff Huard, Puyallup, Wash.

[73] Assignee: Fairchild Semiconductor Corp., Cupertino, Calif.

[21] Appl. No.: 124,971

[22] Filed: Nov. 24, 1987

[51] Int. Cl.[4] ............... H03K 19/003; H03K 19/088; H03K 19/013; H03K 17/04
[52] U.S. Cl. .................... 307/456; 307/443; 307/549; 307/542
[58] Field of Search ............... 307/454, 456, 443, 542, 307/280, 300, 446, 299.1, 473, 270, 466, 458, 547, 549, 551

[56] References Cited

U.S. PATENT DOCUMENTS

| 3,510,685 | 5/1970 | Watanabe et al. | 307/456 |
| 3,999,080 | 12/1976 | Weathersby, Jr. et al. | 307/456 |
| 4,737,665 | 4/1988 | Ovens | 307/456 |

FOREIGN PATENT DOCUMENTS

| 0003323 | 1/1983 | Japan | 307/456 |
| 0057121 | 3/1986 | Japan | 307/456 |

*Primary Examiner*—Stanley D. Miller
*Assistant Examiner*—David R. Bertelson
*Attorney, Agent, or Firm*—Steven F. Caserza; Lee Patch; Mark Aaker

[57] ABSTRACT

A circuit which provides additional drive current during substantially the entire transition of an output signal from a logical one to a logical zero state, thereby causing the pulldown transistor in the TTL output stage to rapidly turn on, providing increased switching speed between logical one and logical zero output state for a given power consumption. Alternatively, for a given switching speed, power consumption is reduced.

26 Claims, 2 Drawing Sheets

TTL CIRCUIT WITH INCREASED TRANSIENT DRIVE

BACKGROUND OF THE INVENTION

This invention deals with TTL circuitry, and in particular to a TTL circuit having increased transient drive for rapid switching between two logical states.

Transistor-Transistor-Logic (TTL) has been used for construction of digital circuits. Digital circuits operate by switching signals between two discrete levels, a logical one or "high" and a logical zero or "low". In order to qualify as a logical zero, a voltage level must not be greater than a predetermined voltage level. When individual TTL integrated circuits are connected on a printed circuit board, for example, the logical zero state is indicated by an output low voltage (VOL) of less than or equal to 0.4 volts, and a logical one is indicated by an output high voltage (VOH) of greater than or equal to 2.4 volts. Within integrated circuits themselves, these VOL and VOH voltages may be designed to have different predetermined values.

Of primary importance in digital circuits is the speed at which transitions occur between logic states, i.e., the speed at which a particular signal can transition from a logical one state to a logical zero state, and vice versa.

FIG. 1a is a schematic diagram of a typical TTL output stage. A digital input signal is applied to input terminal IN1 which controls the operation of phase splitter transistor Q1. Transistor Q1 is termed a "phase splitter" transistor because the digital value on its emitter becomes equivalent to the digital value applied to terminal IN1, and the digital value on the collector of transistor Q1 has the inverse logical value of the input signal applied to input terminal IN1. With a logical one input signal applied to input terminal IN1, transistor Q1 turns on providing current to the emitter of transistor Q1. This current causes output pulldown transistor Q4 to turn on, thereby pulling output terminal OUT1 to ground through the emitter-collector path of conducting pulldown transistor Q4. Simultaneously, the relatively low voltage on the collector of transistor Q1 is insufficient to forward bias the Darlington pair formed by transistors Q2 and Q3, and thus transistors Q2 and Q3 do not source current to output terminal OUT1 when the input signal received on input lead IN1 is a logical one.

Conversely, when the input signal applied to input lead IN1 is a logical zero, transistor Q1 is off, thereby not providing base drive to pulldown transistor Q4. This causes transistor Q4 to be turned off and not sink current from output terminal OUT1 to ground. Simultaneously, the voltage at the collector of transistor Q1 is high since transistor Q1 is not conducting, and causes the Darlington pair formed by transistors Q2 and Q3 to turn on, thereby sourcing current from positive voltage supply VCC to output terminal OUT1.

While the static operation of the circuit of FIG. 1a described above is relatively simple, dynamic operation (i.e., during switching) is more complex. During the transition from a logical zero output signal to a logical one output signal, transistor Q4 must turn off. For this purpose, resistor R2 causes the charge on the base of transistor Q4 to dissipate, thereby allowing output pulldown transistor Q4 to turn off relatively rapidly. Other techniques for discharging the base of transistor Q4 have also been used in the prior art.

Conversely, during the transition from a logical one output signal to a logical zero output signal in response to a logical zero to a logical one transition of the input signal applied to input terminal IN1, transistor Q1 turns on, and transistor Q4 turns on. However, prior to the turn on of transistor Q4, sufficient current must be provided by phase splitter transistor Q1 in order to charge the base of transistor Q4 to cause it to turn on. Some of this current is undesirably consumed by resistor R2 which, as previously described, is essential in order to cause relatively rapid turn off of transistor Q4. Thus, in the circuit of FIG. 1a, there is a trade off between the speed at which transistor Q4 can turn off, and the speed at which transistor Q4 can turn on. There is also a trade off between power consumption and switching speed: higher currents through transistor Q1 allow the base of transistor Q4 to charge more rapidly.

Another prior art circuit is shown in FIG. 1b, which includes all of the elements of the circuit of FIG. 1a, identified with similar numerals. In the circuit of FIG. 1b, feedback diode D1 is provided having its cathode connected to output lead OUT1 and its anode connected to the base of transistor Q10. When the output signal on output lead OUT1 goes low due to conduction of pull-down transistor Q4, feedback diode D1 becomes forward biased, thereby reducing the signal applied to the base of transistor Q10, which in turn reduces the drive available to pull-down transistor Q4. This voltage feedback provided by the addition of feedback diode D1 and transistor Q10 reduces the drive to pull-down transistor Q4 when the output signal on terminal OUT1 reaches the logical zero level, thereby keeping transistor Q10 operating in the linear mode, allowing transistor Q10 to provide additional drive in response to increasing loads on output terminal OUT1. However, this circuit unfortunately has some instability in the form of transient ringing of the output signal on output terminal OUT1 due to the phase lag of signals propagated through the feedback loop provided by feedback diode D1. Transient ringing causes the output signal to vary in amplitude, making it difficult to determine its intended state (i.e., logical one of logical zero).

Another prior art circuit is shown in FIG. 1c, which includes all of the elements of the circuit of FIG. 1a, identified with similar numerals. The circuit of FIG. 1c includes two phase splitter transistors Q1a, Q1b and also includes transistor Q5 having its collector connected to voltage supply VCC through resistor R10, its base connected to the collector of phase splitter transistor Q1, and its emitter connected to input terminal IN1. Thus, transistor Q5 provides additional drive current to input lead IN1 in response to a high to low transition of the output signal on output lead OUT1. However, during this transition, the input signal on input lead IN1 is making a transition from low to high, and thus the additional drive provided by transistor Q5 decreases as the input signal on input lead IN1 increases, midway through the high to low transition of the output signal. This is, of course, undesirable, since the additional drive current is not provided during the entire transition time.

Thus, prior art TTL circuits suffer from problems with the speed at which transitions between logic states can occur, and the power requirements of such circuits.

SUMMARY OF THE INVENTION

In accordance with the teachings of this invention, a circuit is provided which provides additional drive current during the transition of an output signal from a logical one to a logical zero state, providing increased switching speed between the logical one and logical zero output states for a given power consumption. Alternatively, for a given switching speed, power consumption is reduced as compared to prior art circuits. In one embodiment of this invention, a circuit is provided which comprises an input terminal for receiving an input signal, an output terminal for providing an output signal in response to said input signal, first means connected to said output terminal for providing a first voltage to said output terminal in response to a first state of said input signal, second means connected to said output terminal for providing a second voltage to said output terminal in response to a second state of said input signal, control means responsive to said input signal for controlling the operation of said first means and said second means, and transient drive means for providing additional drive to said control means during substantially the entire transition of said output signal in response to a transition of said input signal.

BRIEF DESCRIPTION OF THE DRAWINGS

FIG. 2 is a schematic diagram of one embodiment of this invention shown used in conjunction with the typical TTL prior art output stage of FIG. 1a.

DETAILED DESCRIPTION

Figure 1A:
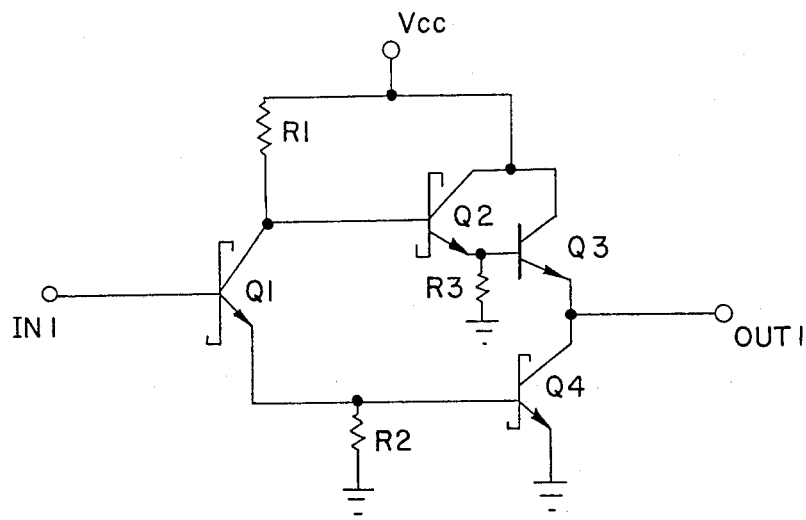
FIG. 1a is a schematic diagram of a typical prior art TTL output stage.
Figure 2:
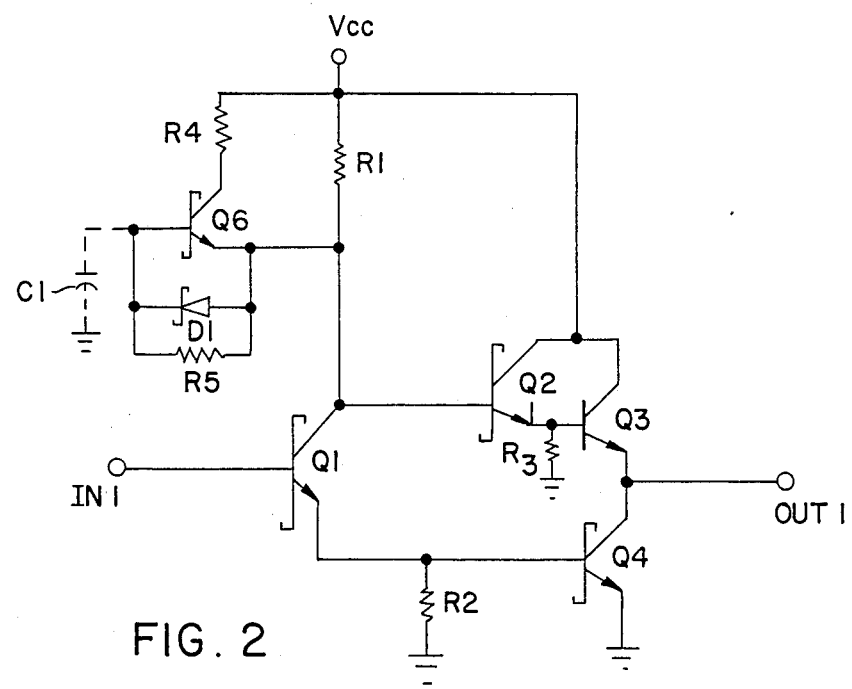

Referring to FIG. 2, resistors R4 and R5, together with diode D1 and transistor Q6, form one embodiment of a transient drive circuit constructed in accordance with the teachings of this invention. As shown in FIG. 2, this transient drive circuit is suitable for use with the prior art TTL output stage as previously described with reference to FIG. 1a. The operation of the transient drive circuit is as follows.

When the output signal on output terminal OUT1 is high, the input signal on input lead IN1 is low, and transistor Q1 is off. As a result, the collector of transistor Q1, and thus the emitter of Shottky transistor Q6, is substantially at VCC. A certain amount of capacitance C1 exists at the base of transistor Q6, due to the junction and metal capacitances of transistor Q6, diode D1, and resistor R5. This so-called "base capacitance" C1 is charged when diode D1 is forward biased. With the input signal on input lead IN1 low, diode D1 is forward biased and causes capacitance C1 connected to the base of Shottky transistor Q6 to be charged to a voltage equal to VCC minus VSBD, where VCC is the supply voltage, and VSBD is the forward biased voltage of Shottky barrier diode D1. In this condition, the transient drive circuit is ready for operation in response to a low to high transition of the input signal applied to input lead IN1. In one embodiment, the transient drive circuit operates such that capacitance C1 is substantially charged by the time the output signal has completed making its transition from a high to a low state. Diode D1 may comprise of any type of rectifier which provides a low impedance during charging of capacitor C1 and a high impedance preventing discharge of capacitor C1 through diode D1.

When the input signal applied to input lead IN1 goes high, phase splitter transistor Q1 turns on, decreasing the voltage on the collector of transistor Q1 and thus the emitter of transistor Q6. Thus, transistor Q6 turns on, with the current flowing through the base-emitter junction of transistor Q6 being "beta multiplied" by the beta of transistor Q6, resulting in transistor Q6 providing a collector current which is significantly greater than its base current. In this manner, additional transient drive is applied by the transient drive circuit to the collector of phase splitter transistor Q1 in order to cause pulldown transistor Q4 to turn on more rapidly. Current from capacitance C1 does not flow from the base of transistor Q6 through reverse biased Shottky barrier diode D1. Only a small amount of discharge current flows from capacitance C1 through resistor R5, which typically has a value on the order of 10K ohms. Discharge current also flows through transistor Q6 when transient drive is being provided.

Resistor R4 serves to limit the transient drive provided by transistor Q6 to a desired amount determined by the configuration and size of the components in the TTL output circuit. Once the charge previously stored in capacitance C1 has dissipated through the base-emitter junction of transistor Q6, transistor Q6 turns off, with resistor R5 holding the base and emitter of transistor Q6 to the same voltage. This discharge time is governed by the value of the "base capacitance" C1 of transistor Q6, the value of resistor R5, and the amount of discharge current which flows through transistor Q6. Thus, during the transition of the output signal on output terminal OUT1 from a logical one to a logical zero, the transient drive circuit provides additional, and transient, drive to cause transistor Q4 to rapidly turn on and in turn provide a rapid transition of the output signal from a high to a low.

As previously described, when the output signal changes from a logical zero to a logical one, parasitic capacitance C1 is rapidly charged to VCC minus VSBD, through the low impedance of forward biased diode D1, causing the transient drive circuit to be readied for operation during the next high to low transition of the output signal on output lead OUT1. This additional current required to charge parasitic capacitance C1 is minimal.

The cycling time of the transient drive circuit is very short, since it takes very little time to charge capacitance C1 connected to the base of transistor Q6 to a value of VCC minus VSBD. As is well known in the art, oftentimes resistors such as resistor R5 is formed in a well region or "tub" of opposite conductivity type as the substrate. In one implementation of the circuit of FIG. 2, the value of capacitance C1 is the sum of the capacitance of diode D1, the tub capacitance of the resistor tub in which resistor R5 is formed, and the base to collector capacitance of transistor Q6. In one implementation of the circuit of FIG. 2, diode D1 and resistor R5 are formed in the same tube in the semiconductor device, in order to increase the size of the tub and therefore increase the tub capacitance which is one component of capacitance C1. Naturally, a capacitor can be used as an alternative to, or an addition to, the parasitic capacitance associated with the base of transistor Q6.

The resistance of resistor R5 is selected in order to time the duration of the transient drive current. The value of resistor R5 is, in one embodiment, selected to cause the transient drive circuit to provide transient drive for a time equal to the fall time of the output signal when switching from a high to low signal (e.g., typically 2 nanoseconds). Thus, the choice of the resistance of resistor R5 is preferably based on the required duration of the transient drive current. For example, the time constant associated with the discharge of capacitor C1 is selected to be about one-third of the maximum time during which transient drive current is provided from transistor Q6, providing that approximately 3 RC time constants is required to guarantee that the output signal reaches less than 5% of the logical one drive signal. As one example, RC time constant of approximately 0.6 nanoseconds is selected when it is desired to provide transient drive current from transistor Q6 for approximately the duration of the 2.0 NS fall time. With a "base capacitance" C1 of, for example, approximately 0.05 pf, the resistance of resistor R5 is determined to be approximately 11.5K ohms.

Limit resistor R4 serves to set the maximum transient current which is supplied by the transient drive circuit. In one embodiment of this invention, the components shown in FIG. 2 are as follows:

| | |
|---|---|
| R1 | 2.5K |
| R2 | 0.6K |
| R3 | 10K |
| R4 | 2K |
| R5 | 10K |
| C1 | 0.05 pf |
| Q1–Q4, Q6 | 15$\mu$ wide × 1.5$\mu$ length emitter |
| D1 | 8$\mu$ × 8$\mu$ |

In practice, the selection of component values is iterative, since the choice of component values affects the value of parasitic capacitance C1, which in turn affects the choice of component values. However, using appropriate computer modeling techniques, for example, such iteration is accomplished rather easily. For example, the resistance value of resistor R1 is chosen to set the steady state drive current, which has a major effect on the power consumption of the buffer circuit. Furthermore, as the steady state current through resistor R1 decreases, the transition of the output signal from a logical zero to a logical one state is made faster. The resistance value of resistor R4 sets the limit of transient drive current applied during the transition of the output signal from a logical one to a logical zero state. The resistance value of resistor R5, the capacitance value of capacitance C1, and the discharge current through transistor Q6 determine the amount of time during which the transient drive current is supplied.

Figure 1B:
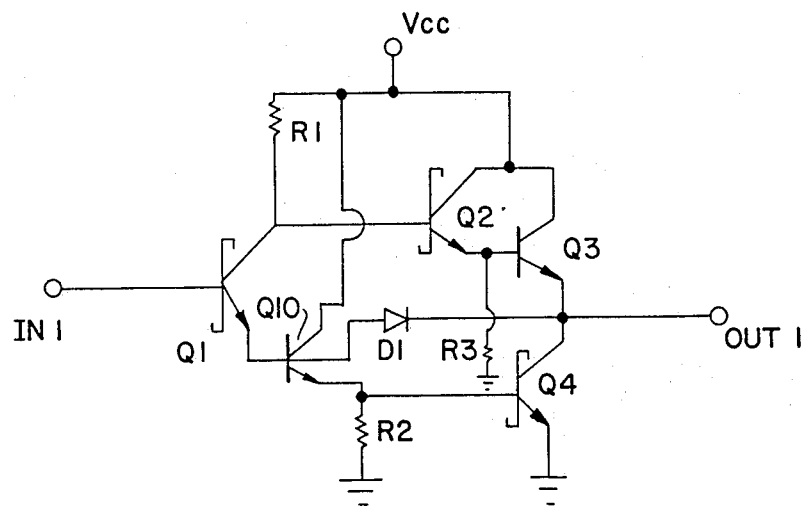
FIG. 1b is a schematic diagram of another prior art TTL output stage.
Figure 1C:
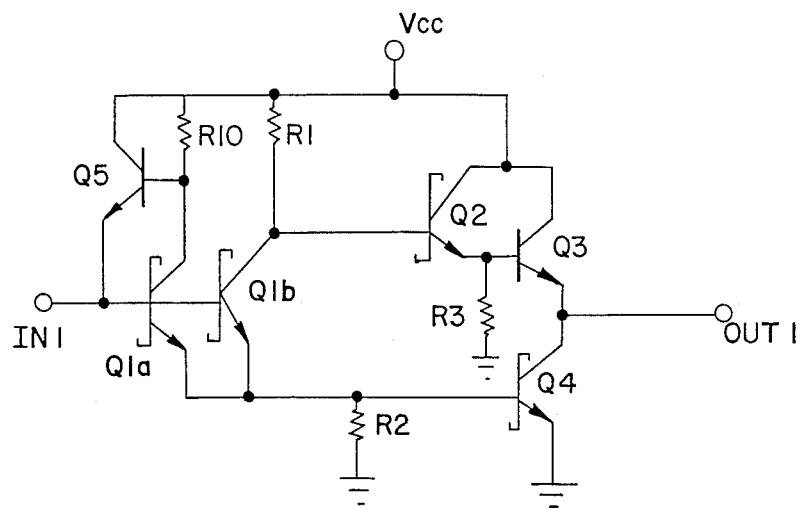
FIG. 1c is a schematic diagram of yet another prior art TTL output stage.

In one embodiment, resistor R1 provides approximately 1.5 milliamps of steady state drive current when the output signal is low. In this embodiment, when operating at 20 Megahertz with a 50 nanosecond clock period, approximately 250 microamps additional power is consumed as a result of the use of the transient drive circuit of FIG. 2. At the cost of this slightly increased power consumption, this embodiment provides an equivalent high to low output signal transition as if resistor R1 was providing 3 milliamps steady state drive current when the output signal is low. Thus, for a very modest increase in integrated circuit surface area due to the presence of the transient drive circuit of this invention, a circuit is provided which, for a specified average power consumption, has improved the transition time by a factor of two or more, compared to the prior art circuit of FIG. 1 which does not include the transient drive circuit of this invention, depending in part on the capacitive load on the output terminal.

In one integrated circuit constructed in accordance with the teachings of this invention, the inclusion of a transient drive circuitry resulted in approximately 10% increase in the surface area of the integrated circuit required for the buffer circuit shown in FIG. 2. While a number of such output buffer circuits were used in the programmable logic array circuit, output buffers accounted for only approximately 15 to 20% of the total circuit surface area. Thus, the additional surface area required to include transient drive circuits in accordance with the teachings of this invention is relatively minimal compared to the decrease in power consumption for a given switching speed. Furthermore, the component values can be selected such that the amount of steady state drive current required to hold the output signal in the low state is minimized, thereby minimizing steady state drive current, while providing adequate transient drive current to insure rapid switching.

The invention now being fully described, it will be apparent to one of ordinary skill in the art that many changes and modifications can be made thereto without departing from the spirit or scope of the appended claims. For example, diode D1 of FIG. 2 can be replaced by any suitable switching device, for example, a transistor having its base and collector connected in common, and the base serving as the anode and the emitter serving as the cathode. Alternatively, a transfer gate can be used to replace diode D1, where the transfer gate is formed from a transistor having a collector serving as the anode, a gate serving as the cathode, and its base connected through a relatively high value (for example, 10K ohms) resistor to a bias voltage. Also, in accordance with the teachings of this invention, the amount of capacitance made available at the base of transistor Q6 can be provided as desired, and can be increased by merely adding additional capacitance to the base of transistor Q6. Such additional capacitance can be provided by any conventional means, including semiconductor capacitors, semiconductor junctions having inherent capacitance, etc.

What is claimed is:

1. A circuit comprising:
   an input terminal for receiving an input signal;
   an output terminal for providing an output signal in response to said input signal;
   first means connected to said output terminal for providing a first voltage to said output terminal in response too a first state of said input signal;
   second means connected to said output terminal for providing a second voltage to said output terminal in response to a second state of said input signal;
   control means responsive to said input signal for controlling the operation of said first means and said second means; and
   transient drive means for providing additional drive to said control means during substantially the entire transition of said output signal in response to a transition of said input signal without regard to changes in the level of said input and output signals during said transition.

2. A circuit as in claim 1 wherein said transient drive means provides additional drive to said control means in response to a voltage change on said control means without regard to changes in the level of said input and output signals during said transition.

3. A circuit as in claim 2 further comprising means for providing said additional drive to said control means for a predetermined period of time without regard to changes in the levels of said input and output signals during said transition.

4. A circuit as in claim 1 wherein said predetermined period of time is selected based on the fall time of said output signal.

5. A circuit as in claim 1 wherein said transient drive means comprises a capacitance for storing charge and a transistor for Beta multiplying said stored charge to provide said additional drive.

6. A circuit as in claim 5 wherein said capacitance comprises stray capacitance in a semiconductor device.

7. A circuit as in claim 5 wherein said transient drive means further comprises means to charge said capacitance when said output signal is in a first state and means for discharging said capacitance when said output signal is transitioning from said first state to a second state.

8. A circuit as in claim 7 wherein said capacitance has been substantially charged when said output signal has completed said transition from said first state to said second state.

9. A circuit as in claim 1, wherein said transient drive means further comprises current setting means for determining the maximum value of said additional drive.

10. A circuit as in claim 9 wherein said current setting means comprises a resistor.

11. A circuit as in claim 1 wherein said transient drive means further comprises means for setting the duration of said additional drive.

12. A circuit as in claim 11 wherein said means for setting comprises a resistor.

13. A circuit as in claim 1 wherein said transient drive means comprises:
a transistor having a first current handling terminal coupled to a supply voltage, a second current handling terminal coupled to said control means, and a control terminal;
a capacitance coupled to said control terminal; and
means for charging said capacitance to a selected value when said output signal is in a first state;
wherein the charge on said capacitance turns said transistor on when said output signal transitions from said first state to a second state, thereby causing said transistor to provide additional drive to said control means.

14. A circuit as in claim 13 wherein said means for charging comprises a diode having a first lead connected to said control terminal of said transistor and a second lead connected to said second current handling of said transistor.

15. A circuit as in claim 14 wherein said diode is a Schottky diode.

16. A circuit as in claim 14 wherein said diode comprises a transistor having its base coupled to its collector, and its base serves as a first lead to said diode, and its emitter serves as a second lead of said diode.

17. A circuit as in claim 14 wherein said diode comprises a transistor having a collector serving as a first lead of said diode, an emitter serving as a second lead of said diode, and a base coupled to a bias voltage.

18. A circuit as in claim 13 wherein said capacitance comprises stray capacitance connected to said control terminal of said transistor.

19. A circuit as in claim 13 wherein said transient drive means further comprises current setting means for determining the maximum value of said additional drive.

20. A circuit as in claim 19 wherein said current setting means comprises a resistor connected between said supply voltage and said first current handling terminal.

21. A circuit as in claim 13 wherein said transient drive means further comprises means for setting the duration of said additional drive.

22. A circuit as in claim 21 wherein said means for setting comprises a resistor coupled in parallel with said means for charging.

23. A method for controlling the transition of an output signal from a first state to a second state comprising the step of providing a transient drive current during substantially the entire transition of said output signal from said first state said second state without regard to changes in the level of said input and output signals during said transition.

24. A method as in claim 23 wherein said transient drive current is provided by a transient drive circuit having means for storing charge.

25. A method as in claim 24 wherein said charge is discharged to control said transient drive current.

26. A method as in claim 25 wherein said means for storing charge is substantially charged during the transition of said output signal from said second state to said first state.

* * * * *